United States Patent
Xu et al.

(10) Patent No.: US 11,353,505 B2
(45) Date of Patent: Jun. 7, 2022

(54) DIFFERENTIAL CLOCK CROSS POINT DETECTION CIRCUIT AND DETECTION METHOD

(71) Applicants: NO. 24 RESEARCH INSTITUTE OF CHINA ELECTRONICS TECHNOLOGY GROUP CORPORATION, Chongqing (CN); CHONGQING GIGACHIP TECHNOLOGY CO. LTD., Chongqing (CN)

(72) Inventors: Mingyuan Xu, Chongqing (CN); Liang Li, Chongqing (CN); Jun Liu, Chongqing (CN); Xiaofeng Shen, Chongqing (CN); Jianan Wang, Chongqing (CN); Dongbing Fu, Chongqing (CN); Guangbing Chen, Chongqing (CN); Xingfa Huang, Chongqing (CN); Xi Chen, Chongqing (CN)

(73) Assignees: NO. 24 RESEARCH INSTITUTE OF CHINA ELECTRONICS TECHNOLOGY GROUP CORPORATION, Chongqing (CN); CHONGQING GIGACHIP TECHNOLOGY CO. LTD., Chongqing (CN)

( * ) Notice: Subject to any disclaimer, the term of this patent is extended or adjusted under 35 U.S.C. 154(b) by 0 days.

(21) Appl. No.: 17/602,993

(22) PCT Filed: Jan. 7, 2020

(86) PCT No.: PCT/CN2020/070598
§ 371 (c)(1),
(2) Date: Oct. 11, 2021

(87) PCT Pub. No.: WO2020/215819
PCT Pub. Date: Oct. 29, 2020

(65) Prior Publication Data
US 2022/0091184 A1   Mar. 24, 2022

(30) Foreign Application Priority Data
Apr. 23, 2019   (CN) .......................... 201910328594.1

(51) Int. Cl.
*G01R 31/317*   (2006.01)
*H03K 19/0948*   (2006.01)

(52) U.S. Cl.
CPC ... *G01R 31/31706* (2013.01); *H03K 19/0948* (2013.01)

(58) Field of Classification Search
None
See application file for complete search history.

(56) References Cited

U.S. PATENT DOCUMENTS

| | | | |
|---|---|---|---|
| 6,388,943 B1 * | 5/2002 | Schell | G06F 1/04 365/189.11 |
| 7,671,602 B1 * | 3/2010 | Hronik | G01R 19/175 324/531 |

(Continued)

FOREIGN PATENT DOCUMENTS

| | | |
|---|---|---|
| CN | 102545880 A | 7/2012 |
| CN | 104052479 A | 9/2014 |

(Continued)

*Primary Examiner* — Jany Richardson
(74) *Attorney, Agent, or Firm* — Tianhua Gu; Global IP Services

(57) ABSTRACT

The present disclosure provides a differential clock cross point detection circuit and a detection method. The detection circuit includes: a first MOS transistor (M1), a second MOS transistor (M2) and a capacitor (C); a drain of the first MOS transistor (M1) is connected to a negative terminal (CLK−) of a differential clock, a gate of the first MOS transistor (M1) is connected to a positive terminal (CLK+) of the differential (Continued)

clock, and a source of the first MOS transistor (M1) is connected to a drain of the second MOS transistor (M2); a gate of the second MOS transistor (M2) is connected to the negative terminal (CLK−) of the differential clock, and a source of the second MOS transistor (M2) is connected to an output terminal through a node; one terminal of the capacitor (C) is connected to a node (A), and the other terminal of the capacitor (C) is grounded.

10 Claims, 2 Drawing Sheets

(56) References Cited

U.S. PATENT DOCUMENTS

| | | | |
|---|---|---|---|
| 2008/0272819 A1* | 11/2008 | Cheng | G06F 1/10 327/298 |
| 2010/0301913 A1* | 12/2010 | Li | H03K 5/1565 327/175 |
| 2014/0266476 A1* | 9/2014 | Kuo | H03K 3/0322 331/57 |

FOREIGN PATENT DOCUMENTS

| | | |
|---|---|---|
| CN | 108306648 A | 7/2018 |
| CN | 108649951 A | 10/2018 |
| CN | 110058150 A | 7/2019 |

* cited by examiner

DIFFERENTIAL CLOCK CROSS POINT DETECTION CIRCUIT AND DETECTION METHOD

CROSS REFERENCE TO RELATED PATENT APPLICATION

The present application is the US national stage of PCT/CN2020/070598 filed on 2020 Jan. 7, which claims the priority of the Chinese patent application No. 201910328594.1 filed on 2019 Apr. 23, which application is incorporated herein by reference.

TECHNICAL FIELD

The present invention relates to the technical field of signal processing, and in particular to a differential clock cross point detection circuit and a detection method.

BACKGROUND

In a signal processing circuit, a clock circuit is required to drive an internal signal processing unit to process an input signal (for example, a digital-to-analog converter needs a clock to convert a digital signal to an analog signal and output a conversion result through the clock). In order to obtain excellent noise and dynamic performance, the clock generally adopts a differential form, and the clock is required to have an ideal duty cycle and cross point. For the differential clock cross point, a detection circuit is needed to detect the position of an output clock cross point, and then the differential clock cross point is adjusted through an adjustment circuit.

An existing differential clock cross point detection circuit generally adopts four MOS devices, gates of two NMOSs are respectively connected to positive and negative terminals of a clock, the output is pulled down when the two NMOSs are turned on at the same time through a differential clock, gates of two PMOSs are respectively connected to the positive and negative terminals of the clock, and the output is pulled up when the two PMOSs are turned on at the same time through the differential clock. For example, according to a cross point detection circuit in the U.S. Pat. No. 9,154,148B2, the cross point detection circuit determines the cross point position of a differential clock by collecting static currents, and the structure and detection process of the whole cross point detection circuit are relatively complex.

SUMMARY

In view of the above defects of the prior art, an objective of the present invention is to provide a differential clock cross point detection circuit, so as to solve the problems of the complex structure and detection process of a cross point detection circuit in the prior art.

In order to achieve the above objective and other relevant objectives, the present invention provides a differential clock cross point detection circuit, including: a first MOS transistor, a second MOS transistor and a capacitor.

A drain of the first MOS transistor is connected to a negative terminal of a differential clock, a gate of the first MOS transistor is connected to a positive terminal of the differential clock, and a source of the first MOS transistor is connected to a drain of the second MOS transistor; a gate of the second MOS transistor is connected to the negative terminal of the differential clock, and a source of the second MOS transistor is connected to an output terminal through a node; one terminal of the capacitor is connected to the node, and the other terminal of the capacitor is grounded.

Optionally, the capacitor includes a polar capacitor, a positive terminal of the polar capacitor is connected to the node, and a negative terminal of the polar capacitor is grounded.

Optionally, the differential clock cross point detection circuit further includes a resistor, and the resistor, between the source of the second MOS transistor and the node, is connected in series with the source of the second MOS transistor and the node.

In order to achieve the above objective and other relevant objectives, the present invention further provides a differential clock cross point detection method, including the steps:

providing any of the above differential clock cross point detection circuit;

collecting and storing negative terminal voltages of the differential clock through the capacitor, and outputting the negative terminal voltages through the output terminal to obtain a first output voltage;

adjusting a cross point of the differential clock, and collecting, storing and outputting the negative terminal voltages of the differential clock again to obtain a second output voltage; and comparing the first output voltage and the second output voltage, and accordingly determining a relative position of two cross points before and after the differential clock.

Optionally, according to a structure of the differential clock cross point detection circuit, the collected and stored through the capacitor is a part, over a time window when the first MOS transistor and the second MOS transistor are turned on at the same time, of the negative terminal voltages of the differential clock.

Optionally, a time constant of the capacitor is much larger than a frequency of the differential clock, such that the stored through the capacitor is a mean value of the negative terminal voltages of the differential clock over the time window when the first MOS transistor and the second MOS transistor are turned on at the same time in a plurality of clock periods.

Optionally, the step of comparing the first output voltage and the second output voltage, and accordingly determining the relative position of the two cross points before and after the differential clock, includes:

if the first output voltage is greater than the second output voltage, the cross point after adjustment is lower than the cross point before adjustment; and if the first output voltage is less than the second output voltage, the cross point after adjustment is higher than the cross point before adjustment.

As described above, the differential clock cross point detection circuit of the present invention has the following beneficial effects:

in the detection circuit of the present invention, through the structural design of the two MOS transistors and the one capacitor, an input clock is collected by using the input clock, static currents do not need to be collected, and the detection circuit is simple in structure principle, and easy to operate.

LIST OF REFERENCE NUMERALS

Figure 1:
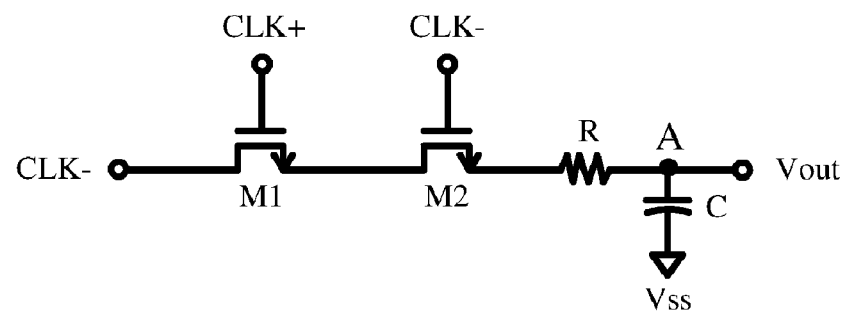
FIG. 1 shows a schematic diagram of a circuit structure of a differential clock cross point detection circuit of the present invention.

M1 First MOS transistor
M2 Second MOS transistor
R Resistor
C Capacitor
CLK+ Positive terminal of differential clock
CLK− Negative terminal of differential clock
Vout Output terminal
Vss Ground terminal
A Node
100 Oscillogram at positive terminal of differential clock
110 Oscillogram at negative terminal of differential clock.

DETAILED DESCRIPTION OF THE PREFERRED EMBODIMENTS

The implementations of the present invention are described below through specific examples. Those skilled in the art can easily understand the other advantages and effects of the present invention from the content disclosed in this specification. The present invention may also be implemented or applied through other different specific implementations. Various details in this specification may also be modified or changed based on different viewpoints and applications without departing from the spirit of the present invention.

Referring to FIGS. 1 to 4, it should be noted that, the drawings provided in the present embodiment only exemplify the basic idea of the present invention, so only the components related to the present invention are shown in the drawings, and the drawings are not drawn according to the numbers, shapes, and sizes of the components in practical implementations. In practice, the patterns, numbers, and scales of the components may be changed arbitrarily, and the layout and configuration of the components may be more complex. It should be understood that all the structures, scales, sizes, and the like depicted in the accompanying drawings of this specification are merely used for illustrating the content disclosed in this specification, for those skilled in the art to learn and read, but are not intended to limit constraints under which the present invention can be implemented, and therefore have no substantial meaning technically. Any modification of the structures, any change in the scale relationship, or any adjustment of the sizes shall fall within the scope of the technical content disclosed in the present invention as long as the effects and objectives of the present invention can be achieved.

As mentioned before in the background, a differential clock cross point detection circuit in the prior art is complex in structure and complicated in operation. Based on this, the present invention provides a differential clock cross point detection circuit which is simple in structure and easy to operate.

In detail, as shown in FIG. 1, the differential clock cross point detection circuit of the present invention includes: a first MOS transistor M1, a second MOS transistor M2 and a capacitor C. A drain of the first MOS transistor is connected to a negative terminal CLK− of a differential clock, a gate of the first MOS transistor is connected to a positive terminal CLK+ of the differential clock, and a source of the first MOS transistor is connected to a drain of the second MOS transistor. A gate of the second MOS transistor is connected to the negative terminal CLK− of the differential clock, and a source of the second MOS transistor is connected to an output terminal Vout through a node a. One terminal of the capacitor C is connected to a node A, and the other terminal of the capacitor C is connected to a ground terminal Vss. In addition, the differential clock cross point detection circuit further includes a resistor R, and the resistor R, between the source of the second MOS transistor M2 and the node A, is connected in series with the source of the second MOS transistor M2 and the node A.

Optionally, the capacitor C adopts a polar capacitor with a higher capacitance value, such as a common aluminum electrolytic capacitor. As shown in FIG. 1, a positive terminal of the capacitor C is connected to the node A, and a negative terminal of the capacitor C is connected to the ground terminal Vss.

In an embodiment of the present invention, a standard 65 nm CMOS process is adopted, when a frequency of the differential clock is 1 GHz, a width to length ratio of the first MOS transistor M1 is W/L=120 nm/60 nm, a width to length ratio of the second MOS transistor M2 is W/L=120 nm/60 nm, a resistance value of the resistor R is 1 kΩ, and a capacitance value of the capacitor C is 200 fF.

Figure 2:
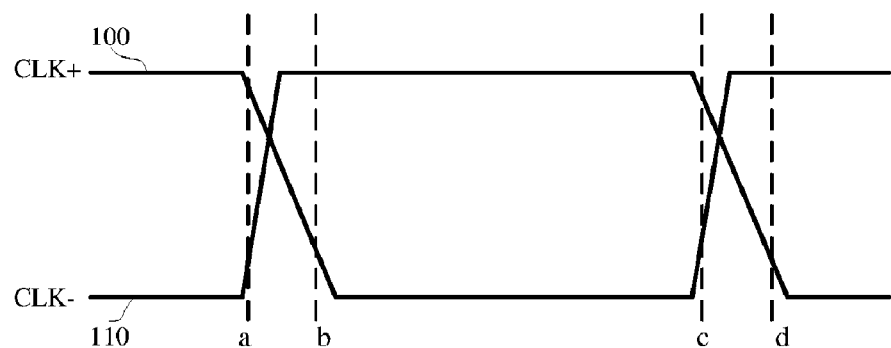
FIG. 2 shows an oscillogram of a clock period with a differential clock cross point high from a center of the differential clock.

FIG. 2 shows an oscillogram of a clock period with a differential clock cross point high from a center of the differential clock, where input oscillograms of the positive terminal and the negative terminal of the detected differential clock are 100 and 110 respectively. It can be known in combination with FIG. 1 and FIG. 2 that a working principle of the differential clock cross point detection circuit is as follows:

In one clock period, the first MOS transistor M1 and the second MOS transistor M2 are turned on and turned off at the same time, the first MOS transistor M1 and the second MOS transistor M2 are turned on at the same time in regions shown by dotted lines a-b and c-d, and the first MOS transistor M1 and the second MOS transistor M2 are turned off at the same time in regions at the left of a, at b-c and at the right of d. When the first MOS transistor M1 and the second MOS transistor M2 are turned on at the same time, a signal 110 reaches the capacitor C through the resistor R, and at the moment, charges stored on the capacitor C are calculated. In the a-b region, the charges stored on the capacitor C is $$Q_1=CV_1,$$

where C is a capacitance value of the capacitor C, and $V_1$ is an average voltage of the signal 110 over the a-b region.

Similarly, in the c-d region, the charges stored on the capacitor C is $$Q_2=CV_2$$

where $V_2$ is an average voltage of the signal 110 over the c-d region.

Figure 3:
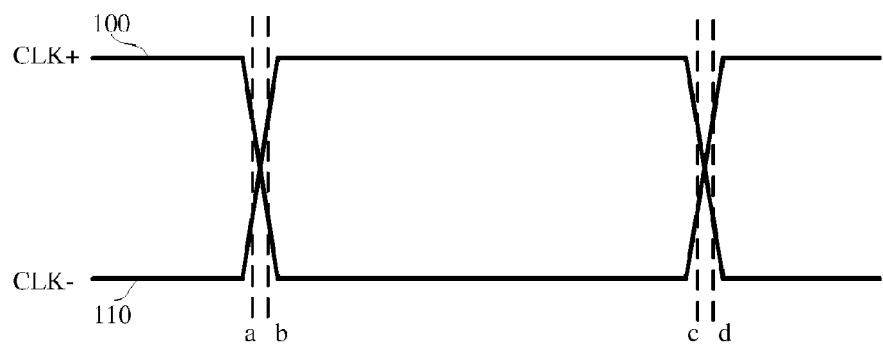
FIG. 3 shows an oscillogram of a clock period with a differential clock cross point low from a center of the differential clock.
Figure 4:
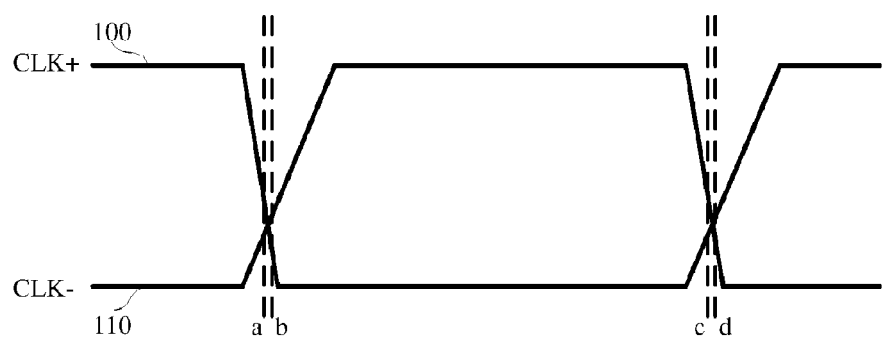
FIG. 4 shows an oscillogram of a clock period at a center of a differential clock cross point.

Therefore, in one clock period, the collected and stored through the capacitor C is a part, over a time window (the a-b region and the c-d region shown by the dotted lines in FIGS. 2 to 4) when the first MOS transistor M1 and the second MOS transistor M2 are turned on at the same time, of negative terminal voltages of the differential clock, that is, a mean value of the charges $Q_1$ and $Q_2$.

In addition, in order to eliminate accidental factors and ensure stable and reliable charge values collected and stored on the capacitor C, a time constant τ of the resistor R and the capacitor C is much larger than the frequency of the differential clock, such that the capacitor C can slowly accumulate variation tendency in a plurality of clock periods, thereby finally reaching the stable mean value of $Q_1$ and $Q_2$. After the plurality of clock periods, the averaged charges stored on the capacitor C will be converted into a voltage through the node A so as to be output at the output terminal Vout, an output voltage of the output terminal Vout is collected, and accordingly a position of an input differential clock cross point is determined.

In detail, referring to FIGS. 2 to 4, if the differential clock cross point is high from the center, as shown in FIG. 2, an average voltage $V_1$ of the signal 110 over the a-b region is slightly larger than an average voltage $V_2$ on the c-d region, a region where the first MOS transistor M1 and the second MOS transistor M2 are turned on at the same time is large, the average voltage $V_1$ and the average voltage $V_2$ are both large, and a mean value of the two is obviously larger than a half of a voltage peak value of the signal 110. If the differential clock cross point is at the center position, as shown in FIG. 3, the average voltage $V_1$ of the signal 110 over the a-b region is equal to the average voltage $V_2$ over the c-d region, the region where the first MOS transistor M1 and the second MOS transistor M2 are turned on at the same time is moderate, values of the average voltage $V_1$ and the average voltage $V_2$ are moderate, and the mean value of the two is approximately equal to a half of the voltage peak value of the signal 110. If the differential clock cross point is low from the center, as shown in FIG. 4, the average voltage $V_1$ of the signal 110 over the a-b region is slightly smaller than the average voltage $V_2$ on the c-d region, the region where the first MOS transistor M1 and the second MOS transistor M2 are turned on is small, the average voltage $V_1$ and the average voltage $V_2$ are both small, and the mean value of the two is obviously smaller than a half of the voltage peak value of the signal 110.

Based on the above analysis, it can be known that the output voltage output by the output terminal Vout is an integral of a window when the first MOS transistor M1 and the second MOS transistor M2 are turned on at the same time to the negative terminal of the differential clock, and an integral result is converted, on the capacitor C, into a voltage to be output. The output voltage obtained when the cross point is at a position high from the center is higher than the output voltage obtained when the cross point is at a center position and at a position low from the center, and the output voltage obtained when the cross point is at the center position is higher than the output voltage obtained when the cross point is at the position low from the center. It can be seen that the magnitude of the output voltage of the output terminal Vout reflects the position of the cross point of the differential clock.

Therefore, the present invention further provides a differential clock cross point detection method based on the above differential clock cross point detection circuit. The method includes the steps:

S1: the above differential clock cross point detection circuit is provided;

S2: negative terminal voltages 110 of a differential clock are collected and stored through a capacitor C, and the voltages are output through an output terminal Vout to obtain a first output voltage;

S3: a cross point of the differential clock is adjusted, and the negative terminal voltages 110 of the differential clock are collected, stored and output again to obtain a second output voltage; and S4: the first output voltage and the second output voltage are compared, and accordingly a relative position of two cross points before and after the differential clock is determined.

In detail, the step S4 that the first output voltage and the second output voltage are compared, and the relative position of the two cross points before and after the differential clock is determined, includes:

if the first output voltage is greater than the second output voltage, the cross point after adjustment is lower than the cross point before adjustment; and if the first output voltage is less than the second output voltage, the cross point after adjustment is higher than the cross point before adjustment.

To sum up, the differential clock cross point detection circuit of the present invention is mainly constructed by the two MOS transistors and the one capacitor, an input clock is collected by using the input clock, and the structure is relatively simple; the relative position of the differential clock cross point before and after adjustment can be determined by comparing the output voltages of the output terminal before and after adjustment of the differential clock cross point, and the detection principle is simple and easy to operate; and the time constant τ of the resistor and the capacitor is much larger than the frequency of the differential clock, such that the value of the output voltages collected and output finally is more stable, and the reliability of detection results is improved.

The above embodiments only exemplarily illustrate the principles and effects of the present invention, but are not intended to limit the present invention. Those skilled in the art may make modifications or changes on the foregoing embodiments without departing from the spirit and scope of the present invention. Therefore, all equivalent modifications or changes made by those of ordinary skill in the art without departing from the spirit and technical idea of the present invention shall be covered by the claims of the present invention.

What is claimed is:

1. A differential clock cross point detection circuit, comprising: a first MOS transistor, a second MOS transistor and a capacitor; wherein
a drain of the first MOS transistor is connected to a negative terminal of a differential clock, a gate of the first MOS transistor is connected to a positive terminal of the differential clock, and a source of the first MOS transistor is connected to a drain of the second MOS transistor; a gate of the second MOS transistor is connected to the negative terminal of the differential clock, and a source of the second MOS transistor is connected to an output terminal through a node; one terminal of the capacitor is connected to the node, and the other terminal of the capacitor is grounded.

2. The differential clock cross point detection circuit according to claim 1, wherein the capacitor comprises a polar capacitor, a positive terminal of the polar capacitor is connected to the node, and a negative terminal of the polar capacitor is grounded.

3. The differential clock cross point detection circuit according to claim 1, further comprising a resistor, wherein the resistor, between the source of the second MOS transistor and the node, is connected in series with the source of the second MOS transistor and the node.

4. A differential clock cross point detection method, comprising the steps:
   providing the differential clock cross point detection circuit according to claim 1;
   collecting and storing negative terminal voltages of the differential clock through the capacitor, and outputting the negative terminal voltages through the output terminal to obtain a first output voltage;
   adjusting a cross point of the differential clock, and collecting, storing and outputting the negative terminal voltages of the differential clock again to obtain a second output voltage; and
   comparing the first output voltage and the second output voltage, and accordingly determining a relative position of two cross points before and after the differential clock.

5. The differential clock cross point detection method according to claim 4, wherein according to a structure of the differential clock cross point detection circuit, the collected and stored through the capacitor is a part, over a time window when the first MOS transistor and the second MOS transistor are turned on at the same time, of the negative terminal voltages of the differential clock.

6. The differential clock cross point detection method according to claim 5, wherein a time constant of the capacitor is much larger than a frequency of the differential clock, such that the stored through the capacitor is a mean value of the negative terminal voltages of the differential clock over the time window when the first MOS transistor and the second MOS transistor are turned on at the same time in a plurality of clock periods.

7. The differential clock cross point detection method according to claim 4, wherein the step of comparing the first output voltage and the second output voltage, and accordingly determining the relative position of the two cross points before and after the differential clock, comprises:
   if the first output voltage is greater than the second output voltage, the cross point after adjustment is lower than the cross point before adjustment; and if the first output voltage is less than the second output voltage, the cross point after adjustment is higher than the cross point before adjustment.

8. The differential clock cross point detection circuit according to claim 2, further comprising a resistor, wherein the resistor, between the source of the second MOS transistor and the node, is connected in series with the source of the second MOS transistor and the node.

9. A differential clock cross point detection method, comprising the steps:
   providing the differential clock cross point detection circuit according to claim 2;
   collecting and storing negative terminal voltages of the differential clock through the capacitor, and outputting the negative terminal voltages through the output terminal to obtain a first output voltage;
   adjusting a cross point of the differential clock, and collecting, storing and outputting the negative terminal voltages of the differential clock again to obtain a second output voltage; and
   comparing the first output voltage and the second output voltage, and accordingly determining a relative position of two cross points before and after the differential clock.

10. A differential clock cross point detection method, comprising the steps:
    providing the differential clock cross point detection circuit according to claim 3;
    collecting and storing negative terminal voltages of the differential clock through the capacitor, and outputting the negative terminal voltages through the output terminal to obtain a first output voltage;
    adjusting a cross point of the differential clock, and collecting, storing and outputting the negative terminal voltages of the differential clock again to obtain a second output voltage; and
    comparing the first output voltage and the second output voltage, and accordingly determining a relative position of two cross points before and after the differential clock.

* * * * *